United States Patent
Kositzki

(10) Patent No.: US 11,579,207 B2
(45) Date of Patent: Feb. 14, 2023

(54) CIRCUIT FOR CHECKING AN ELECTRICAL WIRE CONNECTED TO A DIGITAL INPUT OF AN ACTUATOR

(71) Applicant: WAGO Verwaltungsgesellschaft mbH, Minden (DE)

(72) Inventor: Werner Kositzki, Minden (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 600 days.

(21) Appl. No.: 15/881,389

(22) Filed: Jan. 26, 2018

(65) Prior Publication Data

US 2018/0217197 A1 Aug. 2, 2018

(30) Foreign Application Priority Data

Jan. 27, 2017 (DE) ..................... 10 2017 000 745.4

(51) Int. Cl.
  *G01R 31/08* (2020.01)
  *G01R 31/58* (2020.01)
  *H01R 9/24* (2006.01)

(52) U.S. Cl.
  CPC ............. *G01R 31/58* (2020.01); *G01R 31/08* (2013.01); *H01R 9/2425* (2013.01)

(58) Field of Classification Search
  CPC ....... G01R 31/08; G01R 31/50; H01R 9/2425
  See application file for complete search history.

(56) References Cited

U.S. PATENT DOCUMENTS

| 5,548,208 | A | 8/1996 | Lust | |
|---|---|---|---|---|
| 2006/0161827 | A1* | 7/2006 | Gohel | G01R 1/36 714/736 |
| 2011/0093234 | A1* | 4/2011 | Williams | H01H 47/002 702/115 |
| 2011/0291799 | A1* | 12/2011 | Girard, III | H03K 5/1254 340/5.72 |
| 2013/0162261 | A1* | 6/2013 | Szoke | G01R 31/006 324/503 |
| 2013/0285579 | A1* | 10/2013 | Kawabe | G11B 5/5526 318/135 |
| 2013/0343025 | A1* | 12/2013 | Bdeir | A63H 33/26 361/803 |
| 2014/0288526 | A1* | 9/2014 | Lemke | A61N 1/30 604/500 |

(Continued)

FOREIGN PATENT DOCUMENTS

DE 43 12 760 A1 10/1994

OTHER PUBLICATIONS

Recjercjr. Dr. Hatke, "Redundante 1715-EA" Rockwell Automation, Inc., Series 1715 1839866.

*Primary Examiner* — Son T Le
*Assistant Examiner* — Adam S Clarke
(74) *Attorney, Agent, or Firm* — Muncy, Geissler, Olds & Lowe, P.C.

(57) ABSTRACT

A circuit having a digital output for connecting an electrical wire that is connected to an actuator, the digital output having a high level in a first voltage range, a low level in a second voltage range, and a third voltage range that is formed between the first voltage range and the second voltage range. The circuit being configured to output a test voltage, wherein the test voltage differs by a voltage difference from the high level and the low level.

11 Claims, 2 Drawing Sheets

(56) References Cited

U.S. PATENT DOCUMENTS

| | | | |
|---|---|---|---|
| 2016/0091908 A1* | 3/2016 | Edwards | G05F 1/56 323/274 |
| 2016/0091940 A1* | 3/2016 | Oh | G06F 1/26 713/300 |
| 2020/0106262 A1* | 4/2020 | Anderson | H02H 7/261 |

* cited by examiner

APPLICATION OF A VOLTAGE TO THE ELECTRICAL WIRE, WHEREIN THE VALUE OF THE VOLTAGE IS GREATER OR SMALLER THAN THE VALUES OF A VOLTAGE INTERVAL WHERE THE ACTUATOR IS ACTIVATED — 900

MONITORING OF THE CURRENT FLOW DRIVEN BY THE APPLIED VOLTAGE THROUGH THE ELECTRICAL WIRE — 910

CIRCUIT FOR CHECKING AN ELECTRICAL WIRE CONNECTED TO A DIGITAL INPUT OF AN ACTUATOR

This nonprovisional application claims priority under 35 U.S.C. § 119(a) to German Patent Application No. 10 2017 000 745.4, which was filed in Germany on Jan. 27, 2017, and which is herein incorporated by reference.

BACKGROUND OF THE INVENTION

Field of the Invention

The present invention relates to the checking of an electrical wire connected to a digital input of an actuator.

Description of the Background Art

Line faults, such as line breaks or short circuits of an electrical wire to which a digital input of an actuator is connected are often detected only in case of need, when the actuator cannot be activated when applying an appropriate voltage level to the electrical wire. Activating the actuator before the need arises for diagnostic purposes, however, may be undesirable or impossible (in particular during an ongoing process), for example, if the actuator directly, i.e., not through a disconnectable intermediate member, intervenes in the process.

SUMMARY OF THE INVENTION

It is therefore an object of the present invention to provide a inventive system, a terminal block and a method for checking an electrical wire connected to a digital input of the actuator, which permit a checking of the electrical wire, for example, in respect of short circuit and wire interruption during an ongoing process, and in particular during an ongoing process in which the actuator directly intervenes upon activation.

The system according to an exemplary embodiment of the invention can comprise a terminal block and an actuator that is connected to the terminal block through an electrical wire, wherein the terminal block comprises a circuit with a digital output to which the electrical wire associated with the actuator is connected, the digital output having a high level in a first voltage range, a low level in a second voltage range, and a third voltage range that is formed between the first voltage range and the second voltage range, and the actuator having an activation voltage range, wherein the actuator is activated by applying a voltage in the activation voltage range and the circuit is arranged to output a test voltage and/or a test current, wherein the test voltage differs from the activation voltage range by a voltage difference.

In this context, the term "actuator" can be understood to be, for example, a device which is configured to perform mechanical work in the activated state when supplied with electrical energy.

Further, the term "digital output" can be understood to be, for example, an output which is configured to output discrete voltage levels that are relative to a reference potential. For example, a first voltage level (high level) may be 5 volts and a second voltage level (low level) may be 0 volts. Furthermore, the term "connected" can be understood as a presence of a continuous signal path, for example, a continuous electrical wire (possibly interruptible by a switch) between the connected components.

Further, the term "voltage range", can refer, for example, to voltage ranges relative to the reference potential. For example, with respect to transistor-transistor logic, TTL, the first voltage range may comprise a voltage range of 2.4 volts to 5 volts, or with respect to CMOS logic, a voltage range of 4.4 volts to 5 volts, and the second voltage range with respect to TTL may comprise a voltage range of 0.0 volts to 0.4 volts or, in terms of CMOS logic, 0.0 volts to 0.5 volts. Further, with respect to TTL, the third voltage range may include a voltage range of 0.4 volts to 2.4 volts, or with respect to CMOS logic, a voltage range of 0.5 volts to 4.4 volts.

Since the test voltage is outside the activation voltage range of the digital input of the actuator, the wire can be checked by applying the test voltage or a test voltage pulse without (unintentionally) activating the actuator. For example, an impulse response of the digital input of the actuator can be recorded and evaluated in the form of current and/or voltage characteristics.

The circuit can be further configured to determine a current flow through the digital output, while the test voltage is applied to the digital output.

As an example, if a cable breaks, a lower current flow should be expected than in an error-free case, or in the case of a short circuit, a higher current flow. Thus, errors in the electrical wire can be detected, for example, by comparison with a current flow reference value or a current flow reference curve. In this case, the current flow reference value or the current flow reference curve can be recorded in a learning phase with an error-free connection or generated within the framework of an averaging from various statistically independent measurement series.

The circuit further can be configured to generate an error signal if the determined current flow is below a first threshold value or above a second threshold value.

The first threshold value may be lower than the current flow reference value and the second threshold value may be greater than the current flow reference value, wherein the distances between the current flow reference value and the threshold values may be derived from, for example, (expected or measured) variations in the current flow reference value. The error signal can then indicate the error state as an acoustic or optical signal or be transmitted as a data signal to a higher-level control system which monitors the system.

The circuit can be further configured to repeat the application of the test voltage after a certain time interval, automatically or in response to a signal received from the circuit signal.

By regularly checking, errors in the wire, e.g., can thereby be detected before a desired activation and appropriate measures such as stopping the process or adapting the process to an expected loss of the actuator can be initiated early.

The terminal block according to an exemplary embodiment of the invention for connecting an actuator can comprise a circuit with a digital output for connection to an electrical wire that is connected to the actuator, wherein the digital output has a high level in a first voltage range, a low level in a second voltage range, and a third voltage range that is formed between the first voltage range and the second voltage range, wherein the circuit is configured to output a test voltage and/or a test current in the first voltage range or in the second voltage range, wherein the test voltage differs from the high level and the low level by a voltage difference.

The term "terminal block" can be understood to be, for example, a terminal which is arranged in an insulating housing, wherein the insulating housing is configured to be (detachably) mounted side by side with other insulating housings of the same type. Furthermore, the terminal block can be formed with a further electronic circuit for communication, for example, through a bus system, with terminal blocks of the same type, wherein the terminal blocks are mutually detachably (electrically) connected.

The method includes the features of applying a voltage to the electrical wire, wherein the value of the voltage is greater or lower than values of a voltage interval in which the actuator is activated, and monitoring a current flow driven by the applied voltage through the electrical wire.

Thus, as explained above, the electrical wire can be checked for errors without activating the actuator.

In an embodiment, the method further includes the feature of generating an error signal if the monitored current flow is outside of a certain current flow interval.

For example, the current flow interval can be determined in a learning phase or during the (error-free) operation of the actuator on the basis of a measured current flow and given safety intervals, or in the context of averaging based on various statistically independent measurements.

The method further comprises activating, and then deactivating, the actuator, wherein the activation and deactivation of the actuator precedes the application of the voltage and the monitoring of the current flow.

This way, for example, the danger of existing errors complicating or preventing the subsequent checking can be reduced during the learning phase.

The method can further comprise the feature of repeating the checking of the electrical wire after a time interval by re-applying the voltage and again monitoring a current flow through the electrical wire.

This way, for example, occurring line faults during an ongoing process may be detected prior to activation of the actuator and appropriate measures such as stopping the process or adapting the process to the expected failure of the actuator can be initiated.

The application of the voltage and the monitoring of the current flow can be carried out automatically or in response to a given signal by a circuit integrated in a terminal block.

Also, a circuit is provided for a terminal block having a digital output for connection to an electrical wire that is connected to an actuator, wherein the circuit is configured to output a test voltage, which is outside the activation voltage range of the actuator. By evaluating the test current through the digital output, it is possible to determine whether there is a line fault without activating the actuator.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
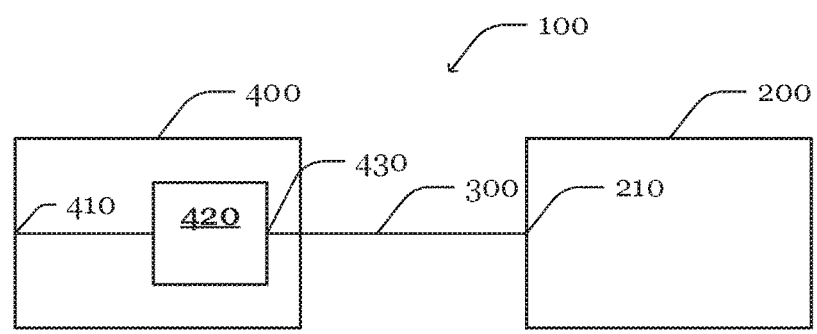
FIG. 1 is a block diagram of a system having an actuator connected to a circuit that is integrated in a terminal block.

FIG. 1 shows a block diagram of a system 100. The system 100 includes an actuator 200, wherein an input 210 of the actuator 200 is connected to a terminal block 400 through an electrical wire 300. The terminal block 400 has an input 410 and an electronic circuit 420 connected to the input 410, said circuit transmitting value- and time-discrete signals to the actuator 200 through a digital output 430. The input 410 of the terminal block 400 may be an analog as well as a digital input 410.

The electronic circuit 420 has two operating states, between which the electronic circuit 420 switches during operation, automatically or caused by a received signal. In the first operating state which corresponds to the normal case, i.e., is active during the process-related use of the actuator, the signals are outputted at the analog input 410 at the output 430 (e.g., looped through) or the signals are replicated or inverted at the digital input 410 at the output 430. That is to say, for example, that a high level at the input 410 causes the outputting of a high level or a low level at the output 430. If, for example, 5 volts or 0 volts are present at the input 410, 5 volts or 0 volts are also outputted at the output 430.

In the second operating state, the wire 300 is tested for faults. In this case, as will be explained in more detail below with reference to FIG. 2, the electronic circuit 420 generates a test voltage at the output 430 that differs from the voltage applied to the input 410 and the low and high levels outputted during the process-related use of the actuator 200. In this case, the conditions under which the electronic circuit 420 switches over between the operating states may be fixed or adjustable depending on the design of the electronic circuit 420.

For example, the electronic circuit 420 may be configured to change to the second operating state and output test voltages according to a fixed or adjustable time frame. Further, it may be fixed or adjustable, depending on whether the outputting of test voltages is suppressed when the signals at the input 410 are designed to cause a high level at the output 430, or when the signals at the input 410 are arranged to effect a low level at the output 430.

For example, when the output of the high level is capable of activating the actuator 200 (i.e., when the high level is within an activation voltage range of the actuator 200), the electronic circuit 420 may be set up or adjusted to not allow generation of the test voltage when a high level is outputted or is to be outputted at the output 430. It can thereby be ensured that the testing of the wire 300 does not disturb or prevent the process-related use of the actuator 200, if the latter is activated or is to be activated by outputting a high level.

Further, when the outputting of the low level is adapted to activate the actuator 200 (i.e., when the low level is within an activation voltage range of the actuator 200), the electronic circuit 420 may be established or set to not permit generation of the test voltage when a low level is outputted or is to be outputted at the output 430. As a result, it can be ensured that the testing of the wire 300 does not disturb or prevent the process-related use of the actuator 200 if the latter is activated or is to be activated by outputting a low level.

Specifically, the electronic circuit 420 may be connected to a mechanical switch, by means of which it is possible to switch between the settings, i.e., the disallowance of a test voltage during the outputting of a high level and the disallowance of a test voltage during the outputting of a low level.

Furthermore, the electronic circuit 420 may have a signal input through which a switching signal can be received, by means of which it is possible to switch between said settings, i.e., the disallowance of a test voltage during the outputting of a high level or the disallowance of a test voltage during the outputting of a low level.

Figure 2:
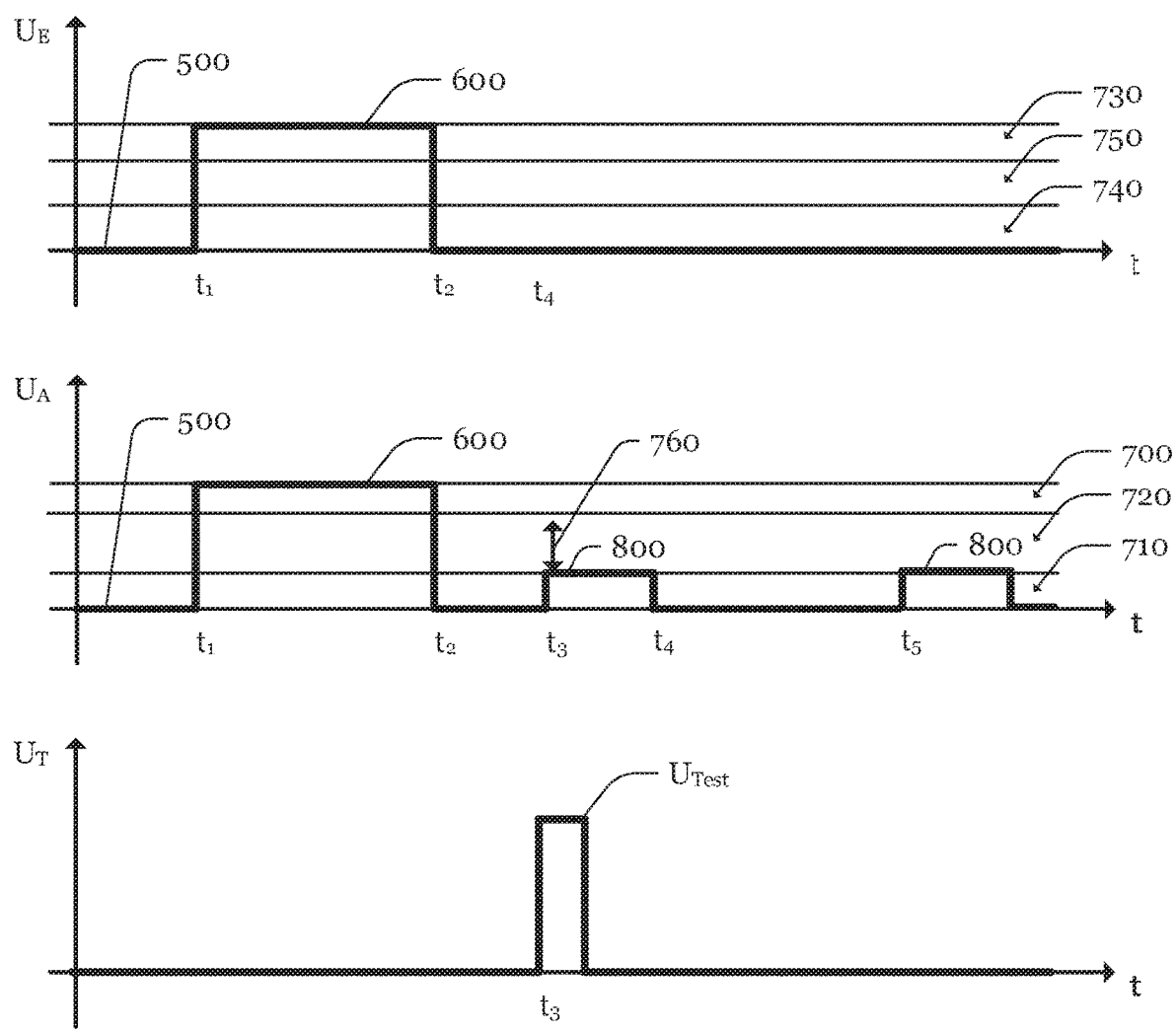
FIG. 2 is an exemplary signal curve for activating the actuator and for checking the electrical wire.

FIG. 2 shows an exemplary voltage curve $U_E$ at the input 410 (in FIG. 2 above) and a partially derived voltage curve $U_A$ at the output 430 (in FIG. 2 below). The signal curve is aimed at the event that the outputting of the high level is suitable for activating the actuator 200. As shown in FIG. 2, a low level 500 is initially applied to the input 410. Since the electronic circuit 420 is in the first operating state, the electronic circuit 420 outputs a low level 500 at the output 430, and switches over at point in time $t_1$, following the signal curve at the input 410, in response to an outputting of a high level 600, whereby the actuator 200 is activated.

The outputted high level 600 (through the actuator 200) can be detected as such in that it lies within a defined first voltage range 700. As such, the outputted high level that is present at the upper end of the first voltage range 700 (e.g., at 5 volts) is exemplary in nature because the circuit 420 could also output lower high levels 600 that would also activate the actuator 200.

As shown in FIG. 2, the electronic circuit 420 switches over at the point in time $t_2$, again following the signal curve at input 410, in response to outputting the low level 500, whereby the actuator 200 is deactivated. It should also be noted in this context that the outputted low level 500 (through the actuator 200) is detected as such since it lies within a defined second (lower) voltage range 710. As such, the outputted low level 500, which is at the lower end of the second voltage range 710 (e.g., at 0 volts), is exemplary in nature because the circuit 420 could also output higher low levels 500 that would also deactivate the actuator 200.

As shown, a third voltage range 720 is located between the first voltage range 700 and the second voltage range 710. The "permanent" outputting of a voltage in the third voltage range 720 is not provided in the first operating state. Rather, the occurrence of voltages in the third voltage range 720 is associated with a transition of the voltage between the first voltage range 700 and the second voltage range 720, while transitions between the first voltage range 700 to the third voltage range 720 with an immediately subsequent return to the first voltage range 700 are not provided.

Similarly, transitions from the second voltage range 710 to the third voltage range 720 directly followed by returning to the second voltage range 710 are also not provided. It should be noted that this also applies to voltages at the input 410, wherein the intended voltage range at the input 410 can also be subdivided into three voltage ranges 730, 740, 750, which correspond to the voltage ranges at the output 430 but comprise a smaller third voltage range 750 (in favor of the first and second voltage ranges 730, 740) to absorb transmission-induced distortions of an outputted voltage.

At the point in time $t_3$, the electronic circuit 420 switches into the second operating state in response to a test signal $U_T$. In the second operating state, a test voltage 800 is briefly applied to the output 430, which differs by a differential voltage from the low level 500 outputted during the first operating state, whereby a voltage pulse is generated, and at the same time by a voltage difference 760 from the input side activation voltage range of the actuator 200, which, for example, corresponds to the first voltage range 730. The current flow $I_{mess}$ generated by the voltage pulse through the output of 430 is measured by the electronic circuit 420 and compared with a reference value $I_{ref}$, which has been, for example, determined on the basis of a previous application of a test voltage 800.

Figures 3, 4:
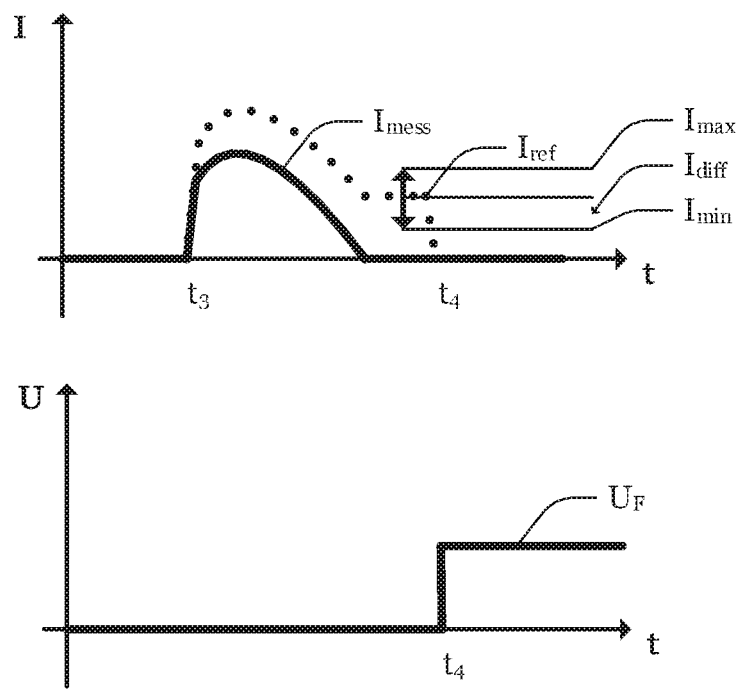
FIG. 3 is an exemplary impulse response when checking the electrical wire and an error signal based thereon.
FIG. 4 is a flowchart of a procedure for checking the electrical wire.

If the measured current flow $I_{mess}$ differs from the reference value $I_{ref}$ by more than a predetermined current difference $!_{diff}$ as shown in FIG. 3, the conclusion is that there is a line fault and an error signal $U_F$ is outputted by the electronic circuit 420. If the measured current flow $I_{mess}$ does not differ from the reference value $I_{ref}$ by more than the predetermined current difference $I_{diff}$, the electronic circuit 420 switches back to the first operating state at $t_4$. Further, as shown in FIG. 2, the application of the test voltage 800 can be repeated after a predetermined interval $t_5-t_3$.

FIG. 4 shows a flowchart of a procedure for checking the electrical wire 300. The process starts at 900 with the step of applying a voltage to the electrical wire 300, which is outside the voltage interval 730 in which the actuator 200 is activated. For example, as described above, the applied voltage is a test voltage 800 that differs from the high and low levels 500, 600 that are applied during the process-related use of the actuator 200. At step 910, the process is continued by monitoring the current flow through the wire 300, based on which line faults can be detected and displayed.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:
1. A system comprising:
a terminal block; and
an actuator connectable to the terminal block via an electrical wire,
wherein the terminal block has a circuit with a digital output to which the electrical wire connectable to the actuator is connected, the electrical wire carrying the digital output to the actuator,
wherein the digital output to the actuator has a high level in a first voltage range, a low level in a second voltage range and a third voltage range that is formed between the first voltage range and the second voltage range,
wherein the actuator has an activation voltage range,
wherein the actuator is activated by applying a voltage in the activation voltage range,
wherein the circuit is configured to output a test voltage over the electrical wire to the actuator, the test voltage being outside of the activation voltage range, and
wherein the circuit is disposed between a power input to the terminal block and the actuator, the power input powering the digital output.

2. The system according to claim 1, wherein the circuit is further configured to determine a current flow through the digital output while the test voltage is applied to the digital output.

3. The system according to claim 2, wherein the circuit is further configured to generate an error signal when the determined current flow is below a first threshold value or above a second threshold value.

4. The system according to claim 1, wherein the circuit is further configured to repeat the application of the test voltage after a certain time interval automatically or in response to a signal received by the circuit.

5. The system according to claim 1, wherein the test voltage is applied to the actuator during a period that the actuator is able to be actuated, and wherein the test voltage is applied to the actuator without activating the actuator.

6. The system according to claim 1, wherein the voltage in the activation range and the test voltage are each transmitted over the electrical wire.

7. The system according to claim 1, wherein the test voltage is lower than voltages in the activation voltage range.

8. The system according to claim 1, wherein the test voltage is applied to the actuator as a time-discrete signal.

9. A terminal block comprising:
a circuit having a digital output and connecting to an electrical wire that is connected to an actuator,
wherein the digital output to the actuator has a first output in a first voltage range, a second output in a second voltage range, and a third voltage range that is formed between the first voltage range and the second voltage range, the first voltage range being higher voltage than the second voltage range,
wherein the circuit is configured to output a test voltage in the second voltage range or the first voltage range,
wherein the test voltage output by the circuit for testing differs by a voltage difference from an actuation output to the actuator in the third voltage range such that the test voltage is outside the third voltage range, and
wherein the circuit is disposed between a power input to the terminal block and the actuator, the power input powering the digital output.

10. The terminal block according to claim 9, wherein the circuit is further configured to determine a flow of current through the digital output while the test voltage is applied to the digital output, and
wherein the circuit is further configured to generate an error signal when the determined flow of current is below a first threshold value or above a second threshold value.

11. The terminal block according to claim 9, wherein the test voltage is applied to the actuator as a time-discrete signal.

* * * * *